(12) United States Patent
Na et al.

(10) Patent No.: US 10,514,275 B2
(45) Date of Patent: Dec. 24, 2019

(54) STATOR USED IN RESOLVERS, AND RESOLVER INCLUDING SAME

(71) Applicant: LS AUTOMOTIVE TECHNOLOGIES CO., LTD., Anyang-si (KR)

(72) Inventors: Byung Cheol Na, Anyang-si (KR); Won Young Lee, Seoul (KR)

(73) Assignee: LS AUTOMOTIVE TECHNOLOGIES CO., LTD (KR)

( * ) Notice: Subject to any disclaimer, the term of this patent is extended or adjusted under 35 U.S.C. 154(b) by 12 days.

(21) Appl. No.: 15/476,913

(22) Filed: Mar. 31, 2017

(65) Prior Publication Data

US 2017/0207670 A1   Jul. 20, 2017

Related U.S. Application Data

(62) Division of application No. 14/716,726, filed as application No. PCT/KR2013/002548 on Mar. 27, 2013.

(30) Foreign Application Priority Data

Nov. 19, 2012 (KR) ...................... 10 2012 013 1094
Jan. 30, 2013 (KR) ...................... 10 2013 001 0429

(51) Int. Cl.
*G01B 7/14* (2006.01)
*G01B 7/30* (2006.01)
(Continued)

(52) U.S. Cl.
CPC ........... *G01D 5/2046* (2013.01); *G01D 5/142* (2013.01); *G01D 5/145* (2013.01); *G01D 5/2053* (2013.01);
(Continued)

(58) Field of Classification Search
CPC .... G01B 7/003; G01D 5/2046; G01D 5/2053; G01D 5/142; G01D 5/145; G01D 5/2033;
(Continued)

(56) References Cited

U.S. PATENT DOCUMENTS

2006/0043815 A1   3/2006  Miya
2006/0119352 A1*  6/2006  Nishimura ............... G01D 5/12
                                                    324/207.25
(Continued)

FOREIGN PATENT DOCUMENTS

EP     0802398    * 10/1997  .............. G01D 5/20
EP     1416254 A1    5/2004
(Continued)

OTHER PUBLICATIONS

EPO issued Extended European Search Report dated Sep. 20, 2016 in EP Application No. 13854536.3, 18 pages.
(Continued)

*Primary Examiner* — Raul J Rios Russo
(74) *Attorney, Agent, or Firm* — Tarolli, Sundheim, Covell & Tummino LLP

(57) ABSTRACT

The embodiments relates to a stator used in resolvers, in which multiple slots are formed at constant intervals in the circumferential direction and have an excitation coil, a first output coil, and a second output coil are respectively wound around the multiple slots. The excitation coil is wound by a number of windings that is changed on the basis of a sinusoidal wave in accordance with the order of the multiple slots in the circumferential direction. After the first output coil is wound by a number of windings resulting from the division of the total number of windings by a constant ratio, the second output coil is wound, and then the rest of the first output coil is wound.

7 Claims, 9 Drawing Sheets

(51) Int. Cl.

| | | |
|---|---|---|
| *H01F 5/00* | (2006.01) | |
| *G01D 5/20* | (2006.01) | |
| *G01V 3/15* | (2006.01) | |
| *G01V 3/08* | (2006.01) | |
| *G01V 3/00* | (2006.01) | |
| *G01D 5/14* | (2006.01) | |
| *H02K 24/00* | (2006.01) | |
| *H02K 1/16* | (2006.01) | |
| *G01R 15/18* | (2006.01) | |
| *G01R 29/20* | (2006.01) | |
| *H02K 19/06* | (2006.01) | |
| *H02K 23/24* | (2006.01) | |
| *H02K 37/20* | (2006.01) | |
| *H02K 47/24* | (2006.01) | |
| *H02K 11/225* | (2016.01) | |
| *G01V 3/165* | (2006.01) | |

(52) U.S. Cl.
CPC ........... *G01R 15/188* (2013.01); *G01R 29/20* (2013.01); *G01V 3/00* (2013.01); *G01V 3/08* (2013.01); *G01V 3/15* (2013.01); *H02K 1/16* (2013.01); *H02K 1/165* (2013.01); *H02K 11/225* (2016.01); *H02K 19/06* (2013.01); *H02K 23/24* (2013.01); *H02K 24/00* (2013.01); *H02K 37/20* (2013.01); *H02K 47/24* (2013.01); *G01V 3/165* (2013.01)

(58) Field of Classification Search
CPC ........ G01D 5/2241; G05B 2219/37124; G05B 2219/37185; G05G 2009/04755
USPC ..... 324/51, 55, 200, 207.11, 207.13, 207.15, 324/207.16, 207.17
See application file for complete search history.

(56) References Cited

U.S. PATENT DOCUMENTS

| | | | |
|---|---|---|---|
| 2006/0232270 A1 | 10/2006 | Ijima | |
| 2007/0194650 A1 | 8/2007 | Ito | |
| 2009/0134737 A1* | 5/2009 | Maekawa | H02K 3/12 310/207 |
| 2009/0179529 A1* | 7/2009 | Makino | B62D 5/0403 310/68 B |
| 2010/0321007 A1* | 12/2010 | Fukuda | G01D 5/2093 324/207.25 |
| 2011/0074400 A1* | 3/2011 | Nakano | G01D 5/2046 324/207.25 |
| 2012/0262121 A1 | 10/2012 | Kuo et al. | |
| 2012/0262161 A1* | 10/2012 | Kinashi | H02K 3/28 324/207.25 |
| 2012/0311850 A1* | 12/2012 | Kubota | G01D 5/2073 29/605 |
| 2013/0009631 A1* | 1/2013 | Tsuge | G01D 5/2046 324/207.18 |
| 2013/0043864 A1* | 2/2013 | Ogawa | H02K 3/28 324/207.15 |
| 2014/0042864 A1* | 2/2014 | Ichikawa | H02K 3/28 310/206 |
| 2014/0125324 A1* | 5/2014 | Jin | G01D 5/2046 324/207.13 |
| 2014/0346910 A1* | 11/2014 | Nakano | H02K 21/16 310/156.01 |
| 2017/0261350 A1* | 9/2017 | Na | H02K 24/00 |

FOREIGN PATENT DOCUMENTS

| | | |
|---|---|---|
| EP | 1498699 A1 | 1/2005 |
| JP | 1998307043 A | 11/1998 |
| JP | 2003307436 | 10/2003 |
| JP | 2009183035 | 8/2009 |
| JP | 2011239506 A | 11/2011 |
| KR | 100927690 | 11/2009 |
| KR | 1020120023800 | 3/2012 |
| KR | 1020120112704 | 10/2012 |
| KR | 101335162 B1 | 11/2013 |
| KR | 101350266 A | 1/2014 |
| WO | 2011158415 A1 | 12/2011 |

OTHER PUBLICATIONS

EPO issued Partial Supplementary European Search Report dated Jun. 24, 2016 in EP Application No. 13854536.3, 7 pages.
KR issued Office Action dated Nov. 28, 2013, in KR Application No. 10-2012-0131094, includes Machine Translation, 7 pages.
KR issued Office Action dated Aug. 18, 2014, in KR Application No. 10-2014-0059940, includes Machine Translation, 15 pages.
KR issued Notice of Allowance dated Dec. 1, 2014, in KR Application No. 10-2014-0059940, includes Machine Translation, 6 pages.
Na, Byung Cheol, et al., "Stator Used in Resolvers, and Resolver Including Same", International Searth Report, dated May 22, 2014, PCT/KR2013/0002548, 7 pages.

* cited by examiner

| | THE TOTAL NUMBER OF TURNS | THE NUMBER OF POLES |
|---|---|---|
| THE NUMBER OF INPUT TURNS(a) | 524 | 2 |
| THE NUMBER OF OUTPUT TURNS #1(b) | 1220 | 10 |
| THE NUMBER OF OUTPUT TURNS #2(b) | 1220 | 10 |

| | THE TOTAL NUMBER OF TURNS | THE NUMBER OF POLES |
|---|---|---|
| THE NUMBER OF INPUT TURNS (a) | 438 | 2 |
| THE NUMBER OF OUTPUT TURNS #1(b) | 1462 | 6 |
| THE NUMBER OF OUTPUT TURNS #2(b) | 1565 | 6 |

| | THE TOTAL NUMBER OF TURNS | THE NUMBER OF POLES |
|---|---|---|
| THE NUMBER OF INPUT TURNS (a) | 420 | 10 |
| THE NUMBER OF OUTPUT TURNS #1(b) | 1532 | 2 |
| THE NUMBER OF OUTPUT TURNS #2(b) | 1532 | 2 |

STATOR USED IN RESOLVERS, AND RESOLVER INCLUDING SAME

The instant application is a divisional application and claims the benefit and priority to the U.S. patent application Ser. No. 14/716,726 that was filed on May 19, 2015, which claims the benefit and priority to the PCT Application Number PCT/KR2013/002548 filed on Mar. 27, 2013, which claims the benefit and priority to the Korean Application Numbers 10-2013-0010429 filed on Jan. 30, 2013, and the Korean Application Number 10-2012-0131094 filed on Nov. 19, 2012, all of which are incorporated herein by reference in their entirety.

BACKGROUND

A variable reluctance type resolver including a stator in which an excitation winding and an output winding are received in multiple slots formed on an annular inner circumferential surface thereof and a rotor disposed to have a predetermined interval from the inner circumferential surface of the stator.

A resolver is a kind of sensor for precisely measuring a rotating speed and a rotating angle of a motor. In particular, a variable reluctance type resolver belongs has a structure in which a coil winding is positioned at a stator and rotors having an oval or multi-polar salient pole are disposed inside the stator while being spaced apart from each other at a predetermined interval.

The existing resolver includes a stator 10 as illustrated in FIG. 1. Multiple slots 11 are formed on the inner circumferential surface of the stator 10 while protruding at a predetermined interval in a circumferential direction.

These slots 11 have an excitation coil, a first output coil, and a second output coil, respectively, wound therearound. As illustrated in FIG. 2, the related art uses a method for simply and sequentially winding an excitation coil 12, a first output coil 13, and a second output coil 14 around an outer circumferential surface of a core part 11a of a slot 11.

As a result, even though the second coil 14 is wound at the same number of windings as the first output coil 13, after the winding operation of the first output coil 13 is performed, a larger amount of coil is consumed in response to a stacked thickness, such that a difference in impedance between the first output coil 13 and the second output coil 14 may occur.

Further, there is a problem in that the existing resolver is sensitive to harmonics and has a great effect on precision under the external magnetic field environment.

Further, the related art forms the excitation coil, the first output coil, and the second output coil in the winding pattern as illustrated in FIG. 11A. However, at the time of manufacturing the stator used in resolvers according to the related art, the total number of turns is increased to obtain a predetermined transformation ratio, and as a result there is a problem in that manufacturing costs are increased and an analysis of an output signal is complicated.

SUMMARY

Exemplary embodiments relate to a resolver which is a contactless rotation detector, and more particularly, to a stator used in resolvers with an improved method of winding coils around multiple slots.

According to some embodiments, a stator included in resolvers is provided and a resolver including the same capable of reducing sensitivity to harmonics to maintain precision despite a change in external magnetic field environment.

In some embodiments a stator is provided and is included in resolvers and a resolver including the same capable of saving manufacturing costs and a manufacturing process.

It is appreciated that in some embodiments a stator is provided and is included in resolvers and a resolver including the same capable of easily analyzing an output signal.

In accordance with one aspect of the embodiments, a stator used in resolvers, in which multiple slots are formed at constant intervals in a circumferential direction and have an excitation coil, a first output coil, and a second output coil, respectively, wound therearound, wherein the excitation coil is wound by the number of windings that is changed in a sinusoidal wave form in accordance with an order of the multiple slots in the circumferential direction, the first output coil is wound by the number of windings resulting from the division of the total number of windings by a constant ratio, the second output coil is wound, and then the rest of the first output coil is wound.

In accordance with another aspect of the embodiments, a stator used in resolvers, in which multiple slots are formed at constant intervals in a circumferential direction and have an excitation coil, a first output coil, and a second output coil, respectively, wound therearound, wherein the first output coil is wound by the number of windings resulting from the division of the total number of windings by a constant ratio, the second output coil is wound, and then the rest of the first output coil is wound, and the multiple slots are provided in a plurality of even numbers.

In accordance with still another aspect of the embodiments, a stator used in resolvers, in which multiple slots are formed at constant intervals in a circumferential direction and have an excitation coil, a first output coil, and a second output coil, respectively, wound therearound, wherein the excitation coil is wound by the number of windings that is changed in a sinusoidal wave form in accordance with an order of the multiple slots in the circumferential direction and the multiple slots are provided in a plurality of even numbers.

Half of the total number of windings of the first output coil may be wound, the second output coil may be wound, and then the rest of the first output coil may be wound.

The winding direction of the first output coil or the second output coil may be changed by being alternated by a predetermined number in accordance with an order of the multiple slots in a circumferential direction.

The excitation coil may be wound by the number of windings that is changed in a sinusoidal wave form in accordance with an order of the multiple slots in the circumferential direction, the first output coil may be wound to have the number of windings changed in the sinusoidal wave form having a phase of +90° relative to a sinusoidal wave of the excitation coil, and the second output coil may be wound to have the number of windings changed in the sinusoidal wave form having a phase of −90° relative to the sinusoidal wave of the excitation coil.

In accordance with yet another aspect of the embodiments, a stator used in resolvers, in which multiple slots are formed at constant intervals in a circumferential direction and have an excitation coil, a first output coil, and a second output coil, respectively, wound therearound, wherein the first output coil is wound at the same number of windings in accordance with an order of multiple slots in a circumferential direction by alternating the winding direction by two slots, the second output coil is wound at the same number of windings in accordance with an order of multiple slots in a circumferential direction by alternating the winding direction by two slots, and the excitation coil is wound by the number of windings that is changed in a sinusoidal wave form in accordance with the order of the multiple slots in the circumferential direction by a method of alternating the winding direction by at least two slots.

The first output coil and the second output coil may have a phase difference of 90°.

The total number of turns of the first output coil or the second output coil may be not less than two times or not more than three times the total number of turns of the excitation coil.

In accordance with still yet another aspect of the embodiments, a stator used in resolvers, in which multiple slots are formed at constant intervals in a circumferential direction and have an excitation coil, a first output coil, and a second output coil, respectively, wound therearound, wherein a continuous winding number in the same direction of the first output coil and the second output coil (the winding number in the same direction is a continuous winding number based on the order of multiple slots in the circumferential direction) is twice or more, and the continuous winding number in the same direction of the excitation coil is a multiple of the continuous winding number in the same direction of the first output coil or the second output coil.

The first output coil and the second output coil may have a phase difference of 90°.

The first output coil or the second output coil may have the same winding number at each slot.

The continuous winding number in the same direction of the first output coil and the second output coil may be equal to or more than three times, and the winding number of the first output coil or the second output coil at each slot may have a sinusoidal wave.

The total number of turns of the first output coil or the second output coil may be not less than two times or not more than three times the total number of turns of the excitation coil.

The winding number of the first output coil or the second output coil at each slot may have the sinusoidal wave form or the square wave form.

At least 20 slots may be provided.

According to the resolver in accordance with some embodiments having the above configuration, it is possible to reduce the sensitivity to harmonics to maintain the precision despite the change in the external magnetic field environment.

Further, according to the embodiments, it is possible to improve the shape of the stator to improve the performance of the resolver and secure the high reliability.

Further, according to the resolver in accordance with the embodiments as configured above, it is possible to save the manufacturing costs or the manufacturing process.

Further, according to the embodiments, it is possible to easily analyze the output signal from the resolver stator.

DETAILED DESCRIPTION

Figure 1:
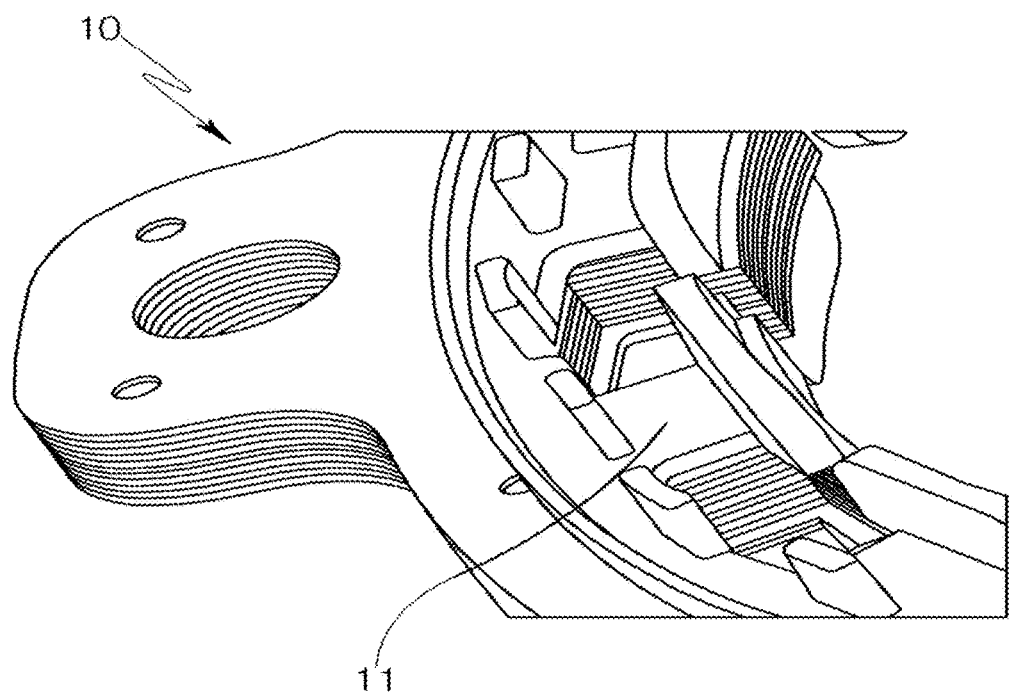
FIG. 1 is a partial perspective view of a stator used in resolvers.
Figure 2:
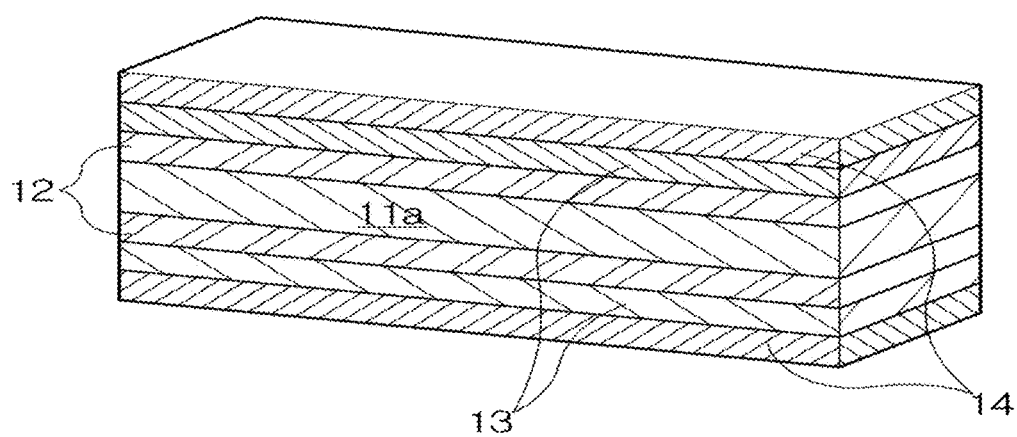
FIG. 2 is a schematic diagram for describing a stacked structure of coils depending on a coil winding for the stator used in resolvers of FIG. 1.

A stator used in resolvers according to an embodiment has a structure as illustrated in FIG. 1 and has an excitation coil 12, a first output coil 13, and a second output coil 14 wound therearound as illustrated in FIG. 2.

However, a method of winding these coils 12, 13, and 14 is different, and therefore the winding method has the following two features.

Figure 3:
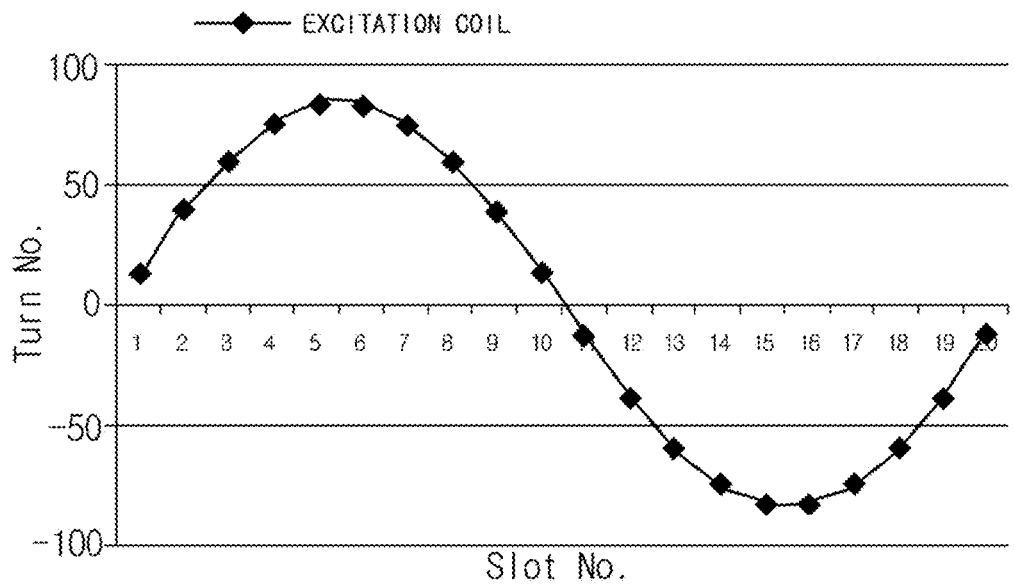
FIG. 3 is a graph illustrating the number of coil windings wound around each slot of the stator used in resolvers according to some embodiments

A first feature relates to the excitation coil 12, in which the excitation coil 12 is wound depending on a graph value illustrated in FIG. 3. In the graph, a horizontal axis represents an order of a slot and a vertical axis represents the number of windings of the excitation coils for each slot. In the graph, the excitation coils 12 corresponding to vertical values represented by points on the graph, that is, the number of windings are wound around each slot of the horizontal axis in order.

The number of slots 11 of the stator according to the embodiment represented in the illustrated graph is 20. It may be appreciated from FIG. 3 that all the excitation coils 12 are wound by the number of windings changed in a sinusoidal wave form in accordance with an order (1 to 20) of the slots.

That is, the excitation coil 2 is wound by the number of windings changed in a sine wave form or a cosine wave form and thus the number of windings changes according to a sinusoidal function. In FIG. 3, the number of windings on the graph having a negative (−) value represents that a winding direction is changed to the opposite direction.

Figure 4:
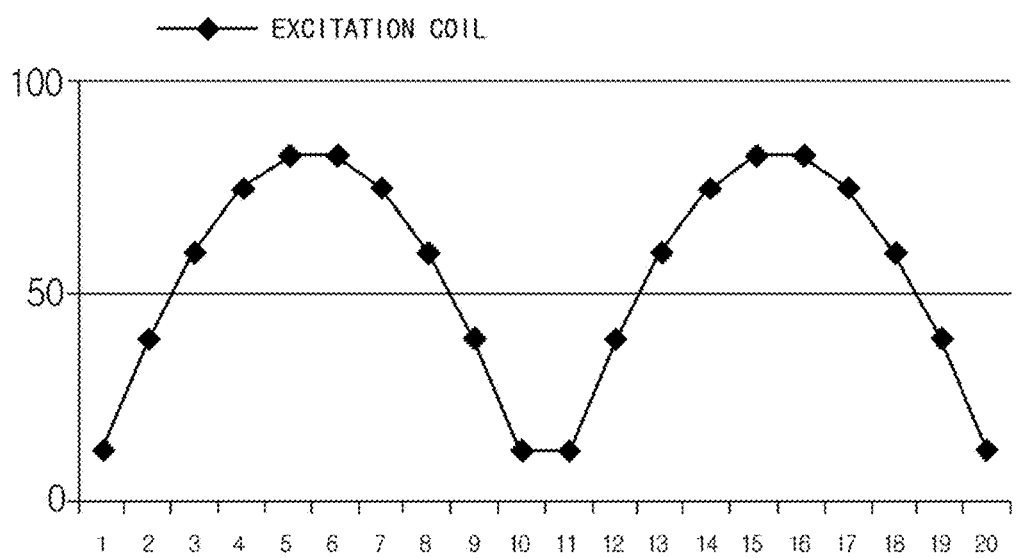
FIG. 4 is a graph obtained by applying an absolute value to a graph value of FIG. 3.

FIG. 4 illustrate a graph modified by taking absolute values of each graph to confirm only the number of windings regardless of a direction in which the excitation coil 12 is wound.

Figures 5A, 5B:
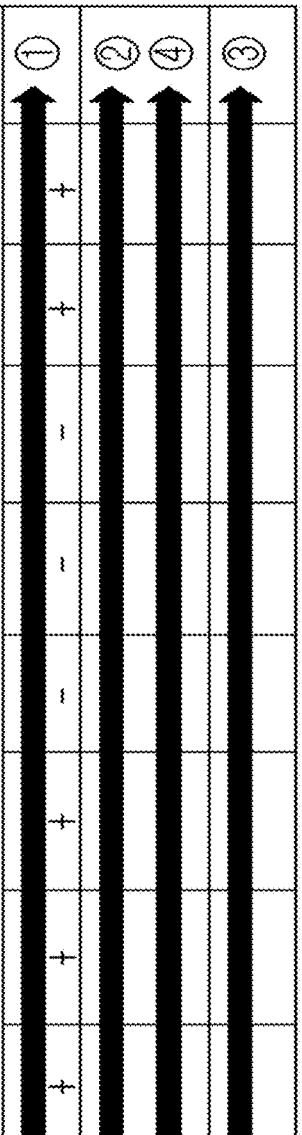
FIGS. 5A and 5B are conceptual diagrams illustrating a winding method according to another embodiment for exemplifying a method for winding an excitation coil and first/second output coils according to some embodiments.

FIGS. 5A and 5B illustrate a winding method according to another embodiment for exemplifying a method for winding the excitation coil 12 and the first/second output coils 13 and 14. The illustrated stator has 24 slots, in which 6 slots form 1 cycle of a sinusoidal wave for an excitation coil 24.

Meanwhile, in the case of the first output 13 and the second output coil 14 wound after the excitation coil is wound, as illustrated in FIG. 5B, half of the total number of windings of the first output coil is wound, the second output coil is wound, and then the rest of the first output coil is wound. In this case, half of the total number of windings is not necessarily wound and the number of windings divided by a constant ratio may be applied.

According to the above feature, the first output coil is divided into two portions by 50% and thus some of the first output coil is first wound and the rest thereof is wound after the second output coil is wound. FIG. 5B is a conceptual diagram illustrating the order relationship, in which a rule of dividing the first output coil into the above two portions may be variously applied. For example, the number of windings for all the slots, respectively, is divided in half, and thus half of the number of windings is wound around all the slots, after the second output coil is wound around all the slots, and then the rest of the number of windings may be wound around all the slots. In another implementation, the first output coil of a half of all the slots is first wound, the second output coil is wound around all the slots, and then the first output coil of the rest of the slots may be wound. (for example, a slot around which the first output coil is wound before the second output coil and a slot around which the first output coil is wound after the second output coil may be implemented to be alternate to each other one by one).

The first output coil and the second output coil may be wound by various methods, in the form complying with the rule of winding the first output coil and the second output coil.

For example, the number of windings of each slot is the same and the first output coil may be wound to have a winding direction (that is, only +/− in the sinusoidal wave form is applied) in the sinusoidal wave form having a phase difference of +90° in the sinusoidal wave form of the excitation coil, and the number of windings of each slot is the same and the second output coil may be wound to have a winding direction (that is, only +/− in the sinusoidal wave form is applied) in the sinusoidal wave form having a phase difference of −90° in the sinusoidal wave form of the excitation coil.

Alternatively, the first output coil may be wound to have the winding direction in the sinusoidal wave form having the phase difference of +90° in the sinusoidal wave form of the excitation coil and the number of windings and the second output coil may be wound to have the winding direction in the sinusoidal wave form having the phase difference of +90° in the sinusoidal wave form of the excitation coil and the number of windings.

Alternatively, the first output coil 13 and the second output coil 14 may alternatively be wound around each slot 11 by changing an order. Alternatively, at least two slots 11 as a unit may be alternatively wound by changing an order.

As described above, all the methods and the order for the windings of the first output coil 13 and the second output coil 14 are exemplified and various methods which are known or performed may be applied.

Figure 6A:
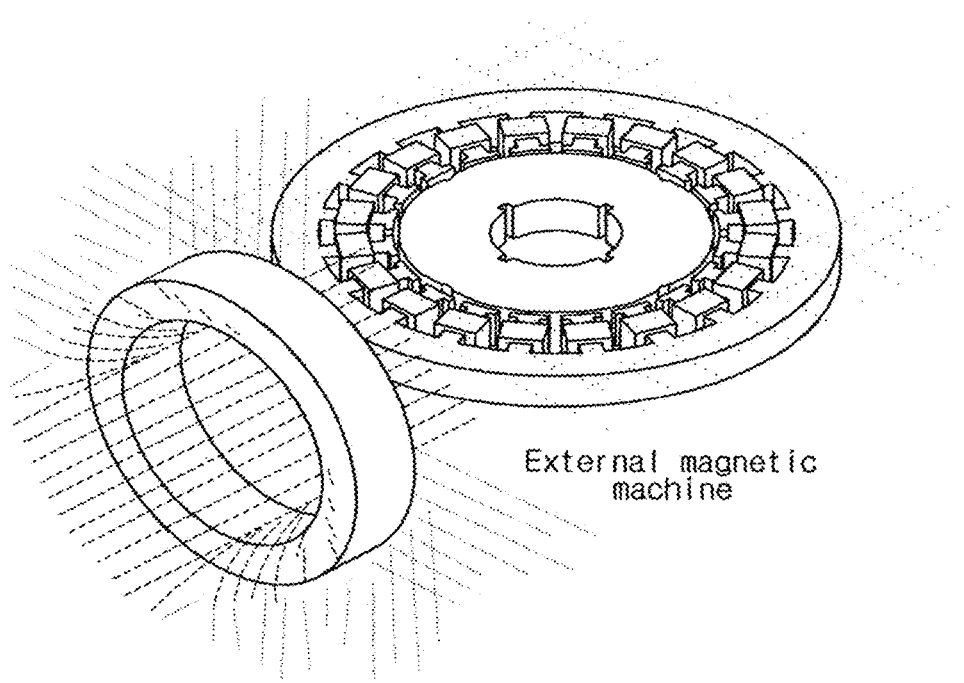
FIGS. 6A and 6B are conceptual diagrams illustrating a simulation concept of the resolver including the stator according to some embodiments which is used under the environment that a high magnetic field exists and a flux distribution as a result of the simulation.
Figure 6B:
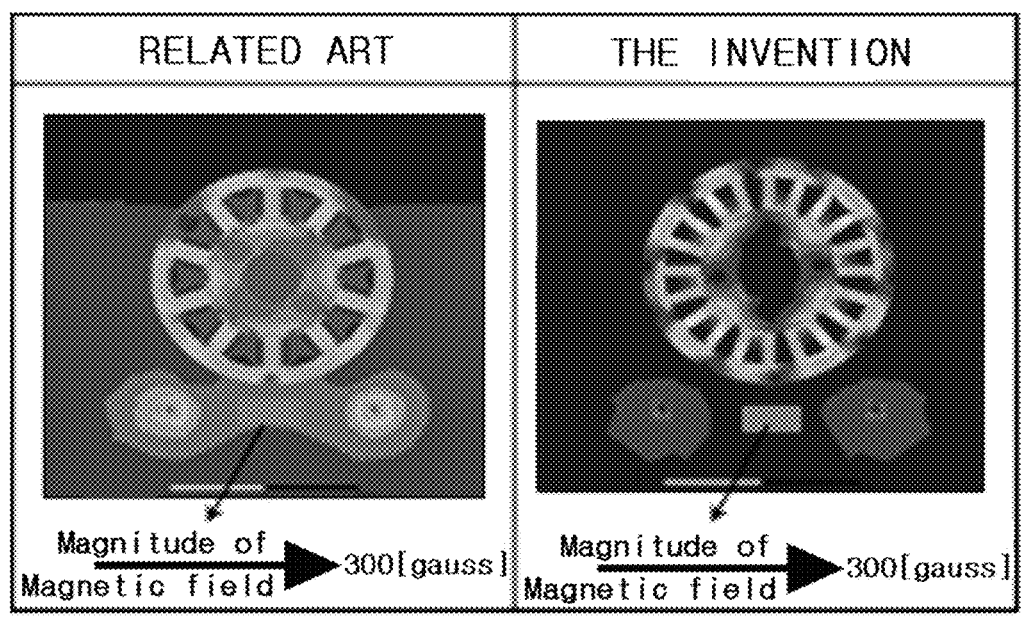

FIG. 6A illustrates a simulation concept of the resolver including the stator according to some embodiments which is used under the environment that a high magnetic field exists and FIG. 6B illustrates a flux distribution as a result of the simulation. In the illustrated simulation, an object having a high magnetic field of 300 gauss is disposed right next to the resolver according to some embodiments and as a result of observing a change in magnetic flux of the stator depending on the operation of the resolver, it may be appreciated from some embodiments that the change in magnetic flux resulting from the object of the external magnetic field is small.

The first output signal of the first output coil and the second output signal of the second output coil are observed.

Figure 7A:
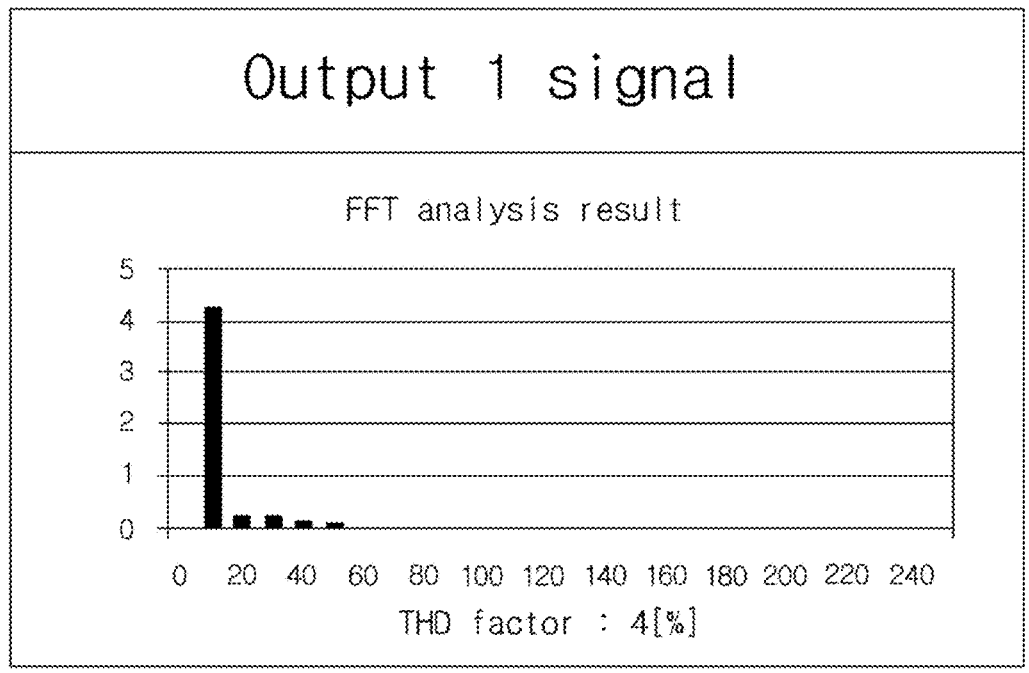
FIGS. 7A and 7B are graphs illustrating a THD factor result depending on an FFT analysis of a first output signal and a second output signal in the simulation of FIG. 6A for the stator according to some embodiments.
Figure 7B:
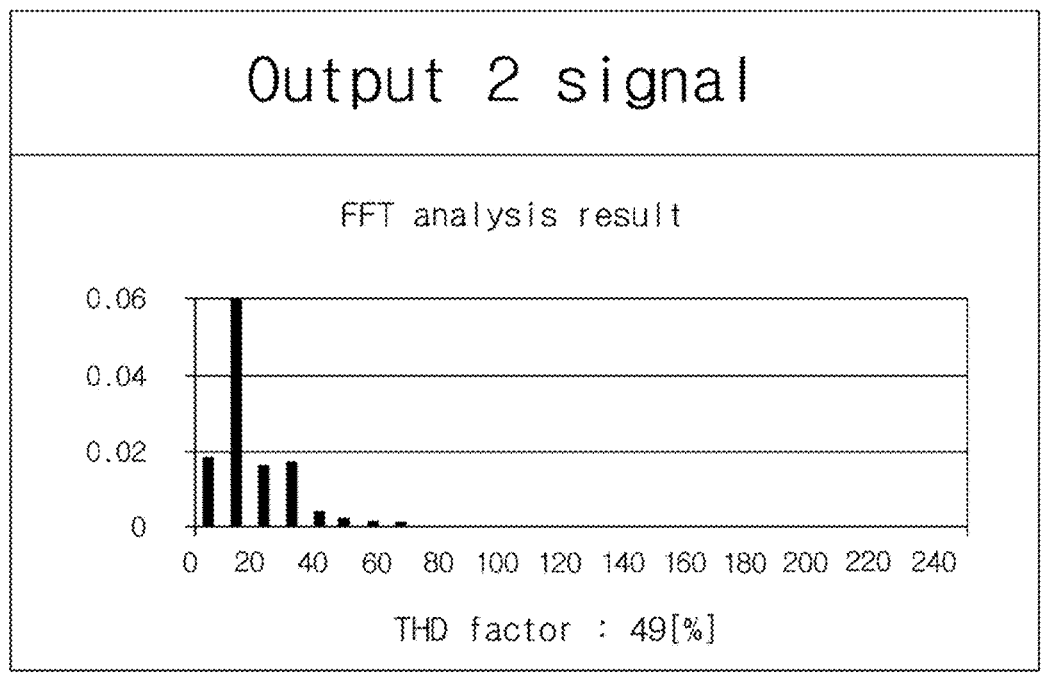

FIG. 7A illustrates a THD factor result depending on an FFT analysis of the first output signal in the simulation of FIG. 6A for the resolver including a stator according to some embodiments and FIG. 7B illustrates the THD factor result depending on the FFT analysis of the second output signal in the simulation of FIG. 6A for the resolver including a stator according to some embodiments.

Figure 8A:
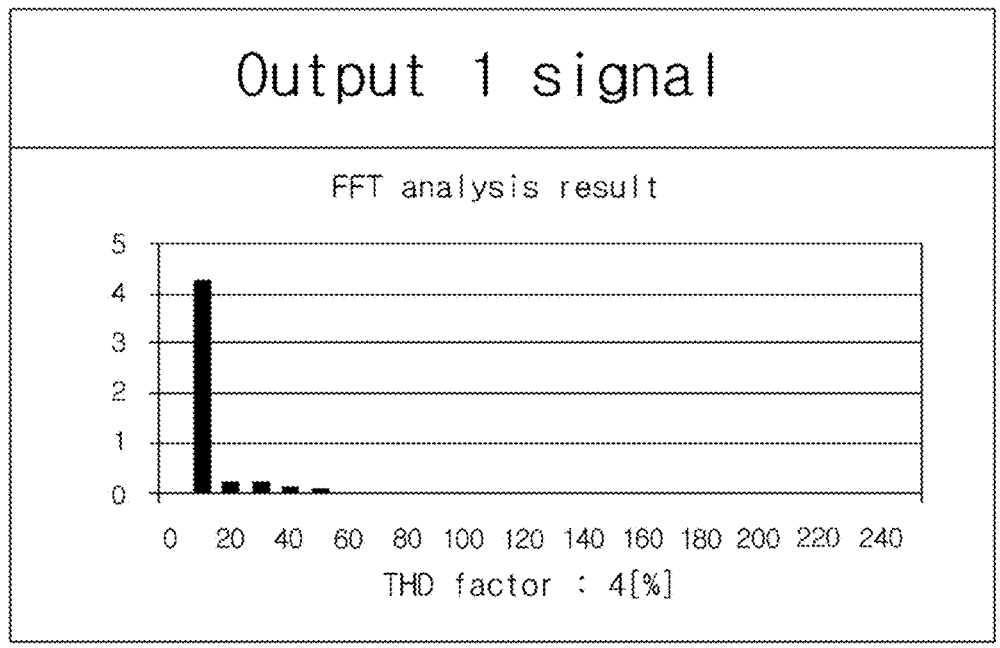
FIGS. 8A and 8B are graphs illustrating the THD factor result depending on the FFT analysis of the first output signal and the second output signal in the simulation of FIG. 6A for the stator according to the related art.
Figure 8B:
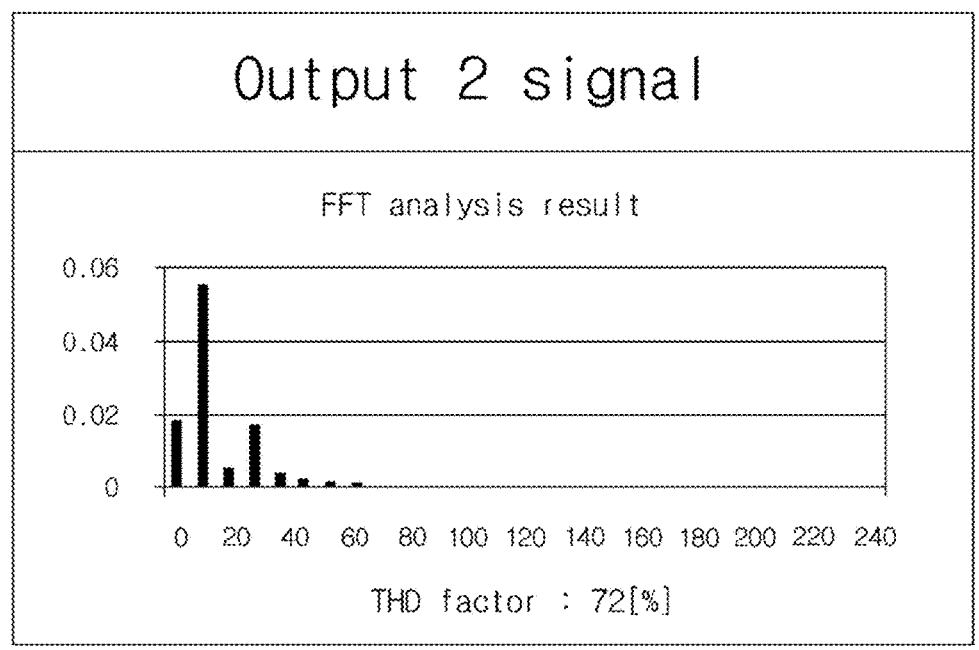

Meanwhile, FIG. 8A illustrates the THD factor result depending on the FFT analysis of the first output signal in the simulation of FIG. 6A for the resolver including the stator according to the related art and FIG. 8B illustrates the THD factor result depending on the FFT analysis of the second output signal in the simulation of FIG. 6A for the resolver including the stator according to the related art.

Reviewing the THD factor results of FIGS. 7A to 8B, it may be appreciated that in some embodiments for the effect of the external magnetic field, the maximum THD factor is 0.49 and in the case of the related art, the maximum THD is 0.72. That is, the resolver according to some embodiments shows that robustness for the external magnetic field is more excellent.

Further, in the experiment of FIG. 6A, according to some embodiments, in the case of the stator having features of the excitation coil having the number of winding changed in the sinusoidal wave form and/or features of the winding order of the first/second output coils, when more than 20 slots are applied, it is found that the effect according to the features of some embodiments is more improved. Further, making the number of slots into 20 numbers or more may more faithfully implement changing the number of windings in the sinusoidal wave form.

Meanwhile, the present embodiment describes that the excitation coil 12 is wound around the slot 11 followed by the first output coil 13 and the second output coil 14 but the embodiments is not limited thereto and therefore the some embodiments are identically applied even to the case in which the excitation coil 12 is finally wound around the slot 11 after the first output coil 13 and the second output coil 14 are wound.

Figures 9A, 9B:
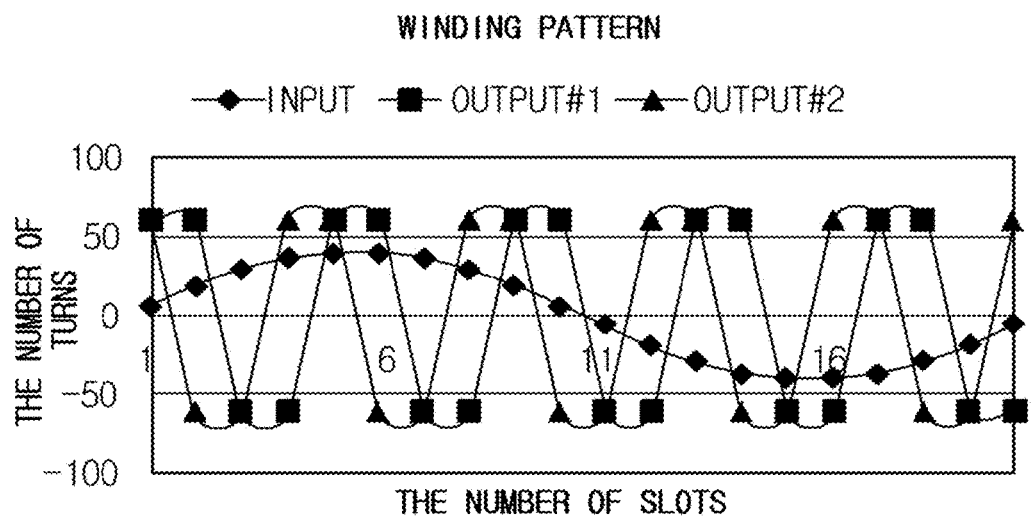
FIG. 9A is a graph illustrating the number of coil windings wound around each slot of the stator used in resolvers according to another embodiment.
FIG. 9B is a table showing the total number of turns and the number of poles related to the number of input turns and the number of output turns of the excitation coil and the first/second output coils of the stator used in resolvers of FIG. 9A.

FIG. 9A is a graph illustrating a winding pattern of the stator used in resolvers according to some embodiments and FIG. 9B is a table showing the number of poles and the total number of turns of the stator used in resolvers according to some embodiments.

In the stator used in resolvers according to the present embodiment, in which multiple slots are formed at constant intervals in the circumferential direction and have the excitation coil, the first output coil, and the second output coil, respectively, wound therearound, the first output coils are wound at the same number of windings in accordance with an order of multiple slots in a circumferential direction by alternating the winding direction by two slots, the second output coils are wound at the same number of windings in accordance with the order of multiple slots in the circumferential direction by alternating the winding direction by two slots, and the excitation coil is wound by having the number of windings that is changed in a sinusoidal wave form in accordance with the order of multiple slots in the circumferential direction by a method of alternating the winding direction by at least four slots.

In the winding structure illustrated, the winding forms of the first output coil and the second output coil are based on 4 slots as one period and the winding form of the excitation coil is based on 20 slots, which is the total number of slots, as one period.

The excitation coil is wound around 10 slots in a positive direction and the remaining 10 slots are wound in a negative direction and have a structure in which the number of windings is increased in the circumferential direction to take the sinusoidal wave form and then is gradually reduced.

The excitation coil is wound in the sinusoidal wave form having a sinusoidal wave form having a longer period and the first/second output coils are wound in the foregoing form at the same number of windings, which has the following advantages.

Further, when the number of input turns is distributed like a sinusoidal wave to distribute a magnetomotive force distribution of a pore in a SIN form, the number of output turns may be distributed in a quadrangle, such that the output end may be constantly applied with magnetic field intensity.

Further, the excitation coil having the relatively small number of windings is allocated with a sinusoidal wave form and the first/second output coils having the large number of windings are wound at the same number, such that the winding thickness of each slot may be uniformly reduced.

Further, a form and a phase of the signal input to the excitation coil are variously applied corresponding to the winding form of the excitation coil, thereby achieving various effects of the resolver and facilitating the application to various fields.

Meanwhile, when the second output coil has the same number of windings but is observed in the sinusoidal wave form, the phase the second output coil may be led by 90° relative to the phase of the first output coil.

Consequently, it is possible to obtain output signals which make it more convenient to calculate the rotation speed and the rotating angle of the rotating shaft.

In FIG. 9B, the total number of turns of the first output coil and the total number of turns of the second output coil each are 1220 and the total number of turns of the excitation coil is 524, which is to satisfy the transformation ratio of 0.27. In the above relationship, a value obtained by multiplying the total number of turns of the excitation coil by the number of poles thereof is still smaller than a value obtained by multiplying the total number of turns of the first/second output coils by the number of poles thereof (that is, the number of input turns and the number of poles<<the number of output turns and the number of poles), which may maximize the transformation ratio with the smaller number of turns than before.

Figures 11A, 11B:
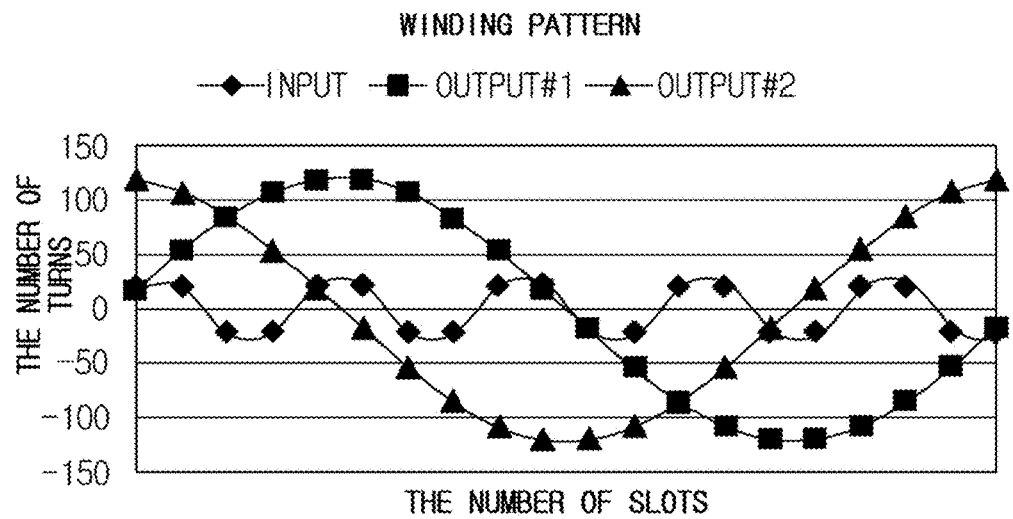
FIG. 11A is a graph illustrating the number of coil windings wound around each slot of a stator used in resolvers according to the related art.
FIG. 11B is a table showing the total number of turns and the number of poles related to the number of input turns and the number of output turns of an excitation coil and first/second output coils of the stator used in resolvers of FIG. 11A.

Compared with FIG. 11B which illustrates a table showing the total number of turns and the number of poles related to the number of input turns and the number of output turns of the excitation coil and the first/second output coils of the stator used in resolvers according to the related art so as to obtain the same transformation ratio of 0.27, the foregoing advantages may be confirmed.

The total number of turns of the first/second output coils according to the present embodiment is preferably not less than two times or not more than three times the total number of turns of the excitation coil. This may obtain a widely used transformation ratio, secure the stable operation of the resolver detection, and save the total number of turns.

In the case of the stator used in resolvers illustrated, the continuous winding frequency in the same direction of the first/second output coils (the winding in the same direction is a continuous frequency based on the order of multiple slots in the circumferential direction) is twice and the continuous winding frequency in the same direction of the excitation coil is ten times. However, in another implementation, the continuous winding frequency in the same direction of the first/second output coils may be equal to or more than three times and the continuous winding frequency in the same direction of the excitation coil may be two times more than the continuous winding frequency in the same direction of the first/second output coils. For example, when the continuous winding frequency in the same direction of the first/second output coils is three times, the continuous winding frequency in the same direction of the excitation coil may be a frequency which is equal to or more than six times.

Further, in the case of the stator having features of the excitation coil having the number of windings changed in the sinusoidal wave form according to the spirit of the present embodiment and/or features of the winding order of the first/second output coils having the pattern changed in a pulse form at the same number of windings, when the number of slots is equal to or more than 18, and preferably is equal to or more than 20, it was confirmed that the foregoing effects according to the features of some embodiments are more improved.

The stator used in resolvers according to another embodiment basically has the structure as illustrated in FIG. 1. As illustrated in FIG. 2, the stator has the excitation coil 12, the first output coil 13, and the output coil 14 wound therearound and the method for winding coils 12, 13, and 14 is similar to that of the first embodiment simply but the winding patterns of the first/second output coils are differentiated from each other depending on the sinusoidal wave form.

Figures 10A, 10B:
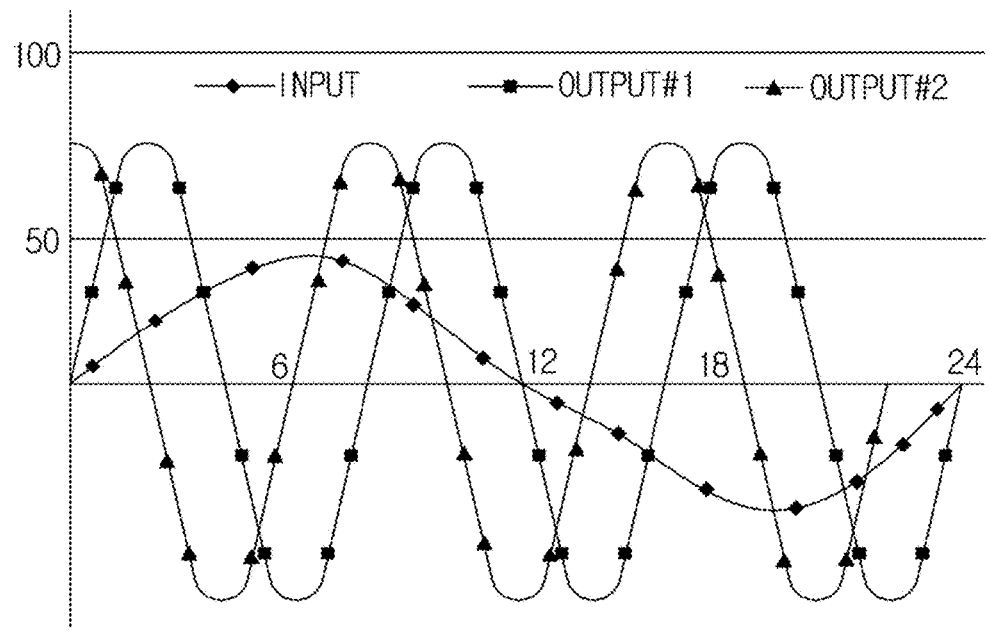
FIG. 10A is a graph illustrating the number of coil windings wound around each slot of a stator used in resolvers according to another embodiment.
FIG. 10B is a table showing the total number of turns and the number of poles related to the number of input turns and the number of output turns of an excitation coil and first/second output coils of the stator used in resolvers of FIG. 10A.

FIG. 10A is a graph illustrating the winding pattern of the stator used in the resolvers according to the present embodiment and FIG. 10B is a table showing the number of poles and the total number of turns of the stator used in the resolvers according to the present embodiment.

In the stator used in resolvers according to the present embodiment, in which multiple slots are formed at constant intervals in the circumferential direction and have the excitation coil, the first output coil, and the second output coil, respectively, wound therearound, the continuous winding frequency in the same direction of the first/second output coils (the winding in the same direction is a continuous frequency based on the order of multiple slots in the circumferential direction) is equal to or more than three times and the continuous winding frequency in the same direction of the excitation coil is equal to or more than twice of the continuous winding frequency in the same direction of the first output coil or the second output coil.

Here, the winding patterns of the first output coil and the second output coil may have the sinusoidal wave form. In the case of the stator used in resolvers illustrated, the continuous winding frequency in the same direction of the first/second output coils (the winding in the same direction is a continuous frequency based on the order of multiple slots in the circumferential direction) is three times and the continuous winding frequency in the same direction of the excitation coil is nine times, and therefore for the winding patterns of the first/second output coils to have the sinusoidal wave form, the winding frequency of the middle slot among the three slots is most and the winding frequency of both slots other than the middle slot may be implemented to be equal to each other.

Meanwhile, in another implementation, the continuous winding frequency in the same direction of the first/second output coils may be equal to or more than four times and the continuous winding frequency in the same direction of the excitation coil may be two times more than the continuous winding frequency in the same direction of the first/second output coils. For example, when the continuous winding frequency in the same direction of the first/second output coils is four times, the continuous winding frequency in the same direction of the excitation coil may be a frequency which is equal to or more than four times.

In FIG. 10A, the continuous winding frequency in the same direction of the first/second output coils is four time and the continuous winding frequency in the same direction of the excitation coil is twelve times. The total number of slots of the stator is 24, the number of poles of the first/second output coils is 6, and the number of poles of the excitation coil is 2.

The stator used in resolvers according to the present embodiment having the above configuration may detect the signal for calculating the rotating speed and the rotating angle of the rotating shaft by an induction phenomenon between the excitation coil having the winding pattern in the sinusoidal wave form having a longer period and the first/second output coils having the winding patterns in the sinusoidal wave form having a shorter period.

Therefore, compared with the embodiment 1, the manufacturing process may be slightly complicated but may enhance the differentiation of a phase detection signal of the resolver by the winding pattern of the sinusoidal wave of the excitation coil and the output coil.

Meanwhile, in the relationship of the first/second output coils having the winding patterns in the sinusoidal wave form having the same period as each other, the phase of the second output coil may be led by 90° relative to that of the first output coil.

Consequently, it is possible to obtain the output signals which make it more convenient to calculate the rotation speed and the rotating angle of the rotating shaft.

Further, according to some embodiments, in the case of the stator having features of the excitation coil having the number of winding changed in the sinusoidal wave form and/or features of the winding order of the first/second output coils, it is found that the effect according to the features of some embodiments is more improved when more than 18 slots are applied. Further, making the number of slots into 18 numbers or more, preferably, 24 numbers or more may more faithfully implement changing the number of windings of the excitation coil and the first/second output coils in the sinusoidal wave form.

The foregoing embodiments describes that the excitation coil 12 is wound around the slot 11 followed by the first output coil 13 and the second output coil 14 but the some embodiments are not limited thereto and therefore the embodiments are identically applied even to the case in which the excitation coil 12 is finally wound around the slot 11 after the first output coil 13 and the second output coil 14 are wound.

Further, the foregoing stator used in resolvers and the resolver including the same are only an example to help understand of the embodiments and therefore it is not to be construed that the scope and the technical scope of the embodiments are not limited to the foregoing description.

The scope and the technical scope of the embodiments are defined by claims and the equivalent scope thereof to be described below.

What is claimed is:

1. A stator used in resolvers, comprising:
   multiple slots defined at constant intervals in a circumferential direction;
   a first output coil having a continuous number of windings around at least two slots in a same winding direction;
   a second output coil having a continuous number of windings around at least two slots in a same winding direction, wherein the same winding direction of the first output coil and the second output coil are the same; and
   an excitation coil having a continuous number of windings around a plurality of consecutive slots in the same winding direction, where the plurality of consecutive slots is a multiple of the at least two slots of the first output coil or the second output coil.

2. The stator used in resolvers of claim 1, wherein the first output coil and the second output coil have a phase difference of 90°.

3. The stator used in resolvers of claim 1, wherein the first output coil or the second output coil has the same continuous number of windings at each slot.

4. The stator used in resolvers of claim 1, wherein the continuous number of windings in the same direction of the first output coil and the second output coil is wound around at least every three slots; and
   the continuous number of windings of the first output coil or the second output coil at each slot has a sinusoidal wave form or a squared wave form.

5. The stator used in resolvers of claim 4, wherein the total number of turns of the first output coil or the second output coil is not less than two times or not more than three times the total number of turns of the excitation coil.

6. The stator used in resolvers of claim 1, wherein at least 20 slots are provided.

7. A resolver including the stator used in resolvers of claim 1.

* * * * *